United States Patent
Cheung

(10) Patent No.: US 7,808,282 B2
(45) Date of Patent: Oct. 5, 2010

(54) OUT-OF-BAND SIGNALING USING DETECTOR WITH EQUALIZER, MULTIPLIER AND COMPARATOR

(75) Inventor: Hung-Yan Cheung, Hong Kong (HK)

(73) Assignee: Pericom Semiconductor Corp., San Jose, CA (US)

( * ) Notice: Subject to any disclaimer, the term of this patent is extended or adjusted under 35 U.S.C. 154(b) by 84 days.

(21) Appl. No.: 12/277,439

(22) Filed: Nov. 25, 2008

(65) Prior Publication Data

US 2010/0127734 A1    May 27, 2010

(51) Int. Cl.
*H03K 5/22*   (2006.01)
(52) U.S. Cl. .............................. 327/63; 327/65; 327/74; 327/77
(58) Field of Classification Search ............... 327/18, 327/20, 63–65, 74, 77, 78, 80, 81; 326/14
See application file for complete search history.

(56) References Cited

U.S. PATENT DOCUMENTS

| | | | |
|---|---|---|---|
| 4,154,978 A | 5/1979 | Tu | |
| 4,188,574 A | 2/1980 | Allington | |
| 5,726,592 A | 3/1998 | Schulte et al. | |
| 6,002,717 A | 12/1999 | Gaudet | |
| 6,445,165 B1 | 9/2002 | Malik et al. | |
| 6,448,806 B1 * | 9/2002 | Roth | 326/16 |
| 6,593,801 B1 | 7/2003 | Hattori | |
| 6,791,371 B1 * | 9/2004 | Cheung | 327/63 |
| 6,897,712 B2 * | 5/2005 | Ficken et al. | 327/537 |
| 6,982,592 B2 * | 1/2006 | Petrovic et al. | 329/323 |
| 7,009,827 B1 | 3/2006 | Lee et al. | |
| 7,394,863 B2 | 7/2008 | Schoenborn | |

\* cited by examiner

*Primary Examiner*—Long Nguyen
(74) *Attorney, Agent, or Firm*—gPatent LLC; Stuart T. Auvinen

(57) ABSTRACT

Power-down mode is activated when equal voltages are detected on a pair of differential inputs. The voltage difference across the differential inputs is equalized by an equalizer and then applied to a multiplier and smoothed and filtered by a low-pass filter to produce an average signal. The average signal is compared to a reference voltage to detect when the voltage difference across the differential inputs is too small. A power-down signal is activated when the average signal is too small. The reference voltage compared can be generated by an equalizer, multiplier, and low-pass filter to match process, temperature, and supply-voltage variations in the primary signal path. The multipliers can be implemented with Gilbert cells. The equalizers can receive control signals to control attenuation of different frequency components.

20 Claims, 5 Drawing Sheets

OUT-OF-BAND SIGNALING USING DETECTOR WITH EQUALIZER, MULTIPLIER AND COMPARATOR

FIELD OF THE INVENTION

This invention relates to electronic systems, and more particularly to powering down when equal voltages are detected on differential inputs.

BACKGROUND OF THE INVENTION

Some electronic systems use differential signaling to improve speed and noise immunity. A pair of differential signals has one signal line driven high when the other signal line is driven low to transmit a bit of data. The difference in voltage between the two signal lines in the differential pair, rather than the absolute voltages, determines the data state.

Failures can occur, such as when a cable carrying a differential pair breaks or is accidentally disconnected. Fail-safe circuits are sometimes added to differential inputs to detect when such a cable break occurs. Often a load resistor at the receiver side of a cable connects the two signal lines in the differential pair.

When the cable is disconnected, the load resistor equalizes the voltages on the two signal lines until both signal-line inputs to the differential receiver have the same voltage. This same-voltage condition is detected by the differential receiver, and the output of the differential receiver is forced to a known state, rather than left in an unstable or undefined state.

Rather than simply force the differential receiver output to a known state, detection of equal voltages on the differential input signal lines can be used to power-down a circuit or sub-system. See for example, "Power Down Mode Signaled by Differential Transmitter's High-Z State Detected by Receiver Sensing Same Voltage on Differential Lines", U.S. Ser. No. 10/064,074, filed Jun. 7, 2002, now U.S. Pat. No. 6,593,801, and "Power-Down Activated by Differential-Input Multiplier and Comparator", U.S. Ser. No. 10/249,280, filed Mar. 27, 2003, now U.S. Pat. No. 6,791,371, both assigned to Pericom Semiconductor Corp. of San Jose, Calif.

While such equal-voltage detectors for power-down control are useful, a more advanced detector is desired for detecting the equal-voltage condition on a pair of differential lines. An advanced equal-voltage detector and power-down circuit is desired.

DETAILED DESCRIPTION

The present invention relates to an improvement in differential detectors. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
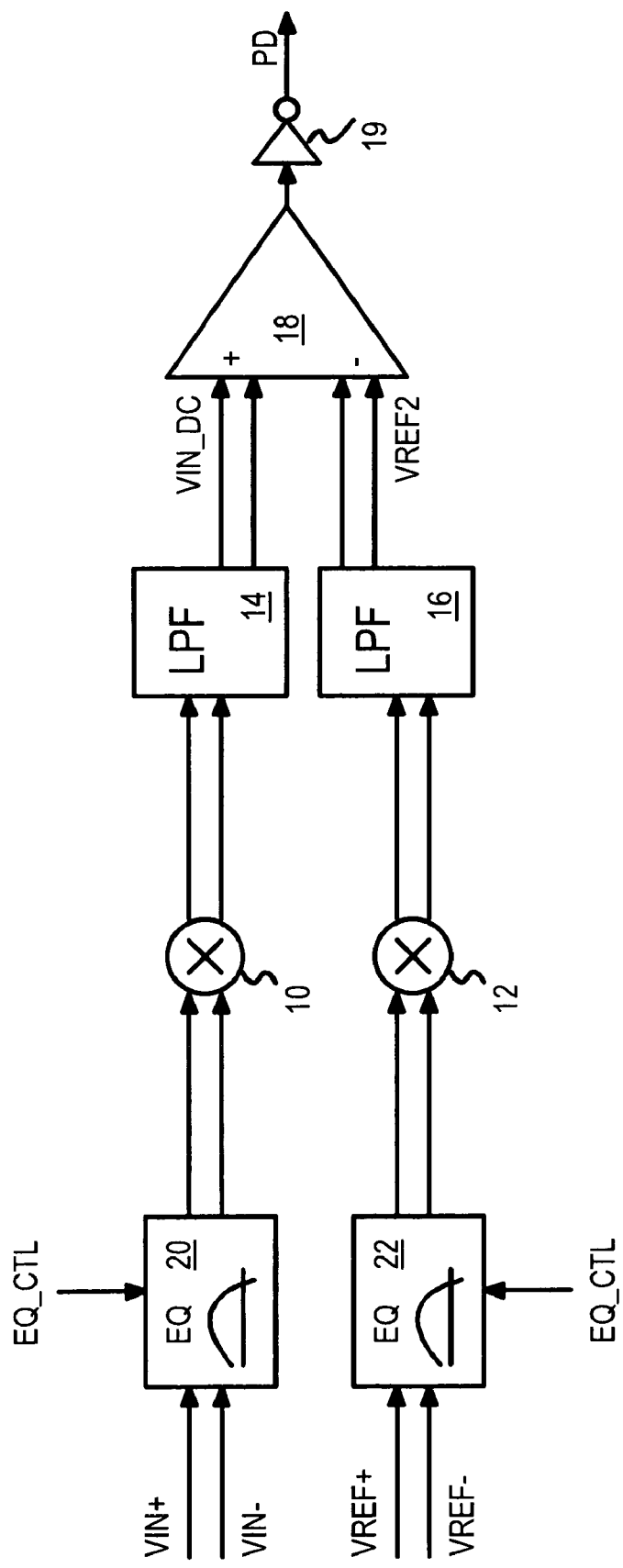
FIG. 1 is a block diagram of an equalizing equal-voltage detector for a differential input.

FIG. 1 is a block diagram of an equalizing equal-voltage detector for a differential input. The voltages on a pair of differential inputs are normally different, except for a brief moment at cross-over during switching. When the voltages are equal, a failure is usually the cause, such as when a cable carrying the differential pair is disconnected or broken.

Differential inputs VIN+, VIN− are normally driven to opposite states by a differential transmitter (not shown). A load resistor (not shown) between VIN+ and VIN−, or a pair of resistors to a constant voltage such as ground drives both VIN+, VIN− to the same voltage when the transmitter no longer drives the differential inputs, such as when the transmitter is disconnected due to a cable break.

Differential inputs VIN+, VIN− are input to equalizer 22. Equalizer 22 can restore high-frequency components relative to low-frequency components of the input signal on VIN+, VIN−. One or more control signals EQ_CTL controls operation of equalizer 22 so that the degree of equalization and attenuation of different frequency components can be controlled, such as by external pins or by a programmable register.

The equalized signals output by equalizer 22 are input to differential multiplier 10, in both the normal and reverse connections. The voltage difference (on equalized VIN+- VIN−) is multiplied by the reverse voltage difference (equalized VIN−-VIN+) by differential multiplier 10. When the amplitude of the voltage difference is A, the output of differential multiplier 10 is $A^2$. For a sine-wave input, the averaged output of differential multiplier 10 is $A^2/2$.

The output of differential multiplier 10 is filtered by low-pass filter 14 to produce a smoothed or averaged voltage VIN_DC. This averaged voltage VIN_DC can be the average over several cycles of the differential input at the target switching frequency. The averaged voltage VIN_DC is a differential signal.

The averaged voltage VIN_DC is applied to a differential non-inverting (+) input of differential comparator 18. The inverting input (−) of differential comparator 18 receives a differential reference voltage VREF2. When the differential voltage of the differential VIN_DC is above the differential voltage on the differential VREF2 input, differential comparator 18 outputs a high to inverter 19, which drives power-down signal PD low (inactive).

When VIN_DC is below VREF2, differential comparator 18 outputs a low to inverter 19, which drives power-down signal PD high (active). Since VIN_DC is proportional to the square of the equalized absolute voltage difference between differential inputs VIN+, VIN−, VIN_DC is a measure of the differential signal strength. When a failure occurs and VIN+, VIN− are the same voltage, VIN_DC drops to zero. Reference voltage VREF2 can be set to a predetermined value that is below VIN_DC during normal operation, but above VIN_DC when differential inputs VIN+, VIN− are the same. The exact value of VREF2 used can be estimated or determined by circuit simulation, and a range of values may be substituted. Sensitivity of the power-down detector can be increased by lowering VREF2, while false triggering can be reduced by increasing VREF2.

The differential VREF2 signals applied to differential comparator 18 are generated by a similar path as that for VIN_DC. A differential reference voltage VREF+, VREF− is applied to equalizer 24, which receives the same control signal EQ_CTL as equalizer 22. Equalizers 22, 24 may have the same circuit arrangement and devices sizes to match their operational properties.

The equalized reference voltage output from equalizer 24 is applied to differential multiplier 12, which matches differential multiplier 10. The output of differential multiplier 12 is applied to low-pass filter 16, which matches low-pass filter 14. The output of low-pass filter 16 is a differential voltage VREF2, which is applied to the inverting inputs of differential comparator 18.

Since equalizer 24, differential multiplier 12, and low-pass filter 16 match equalizer 22, differential multiplier 10, and low-pass filter 14, process, supply-voltage, and temperature variations are matched in both the VIN signal path and the reference voltage VREF2 path.

Figure 3:
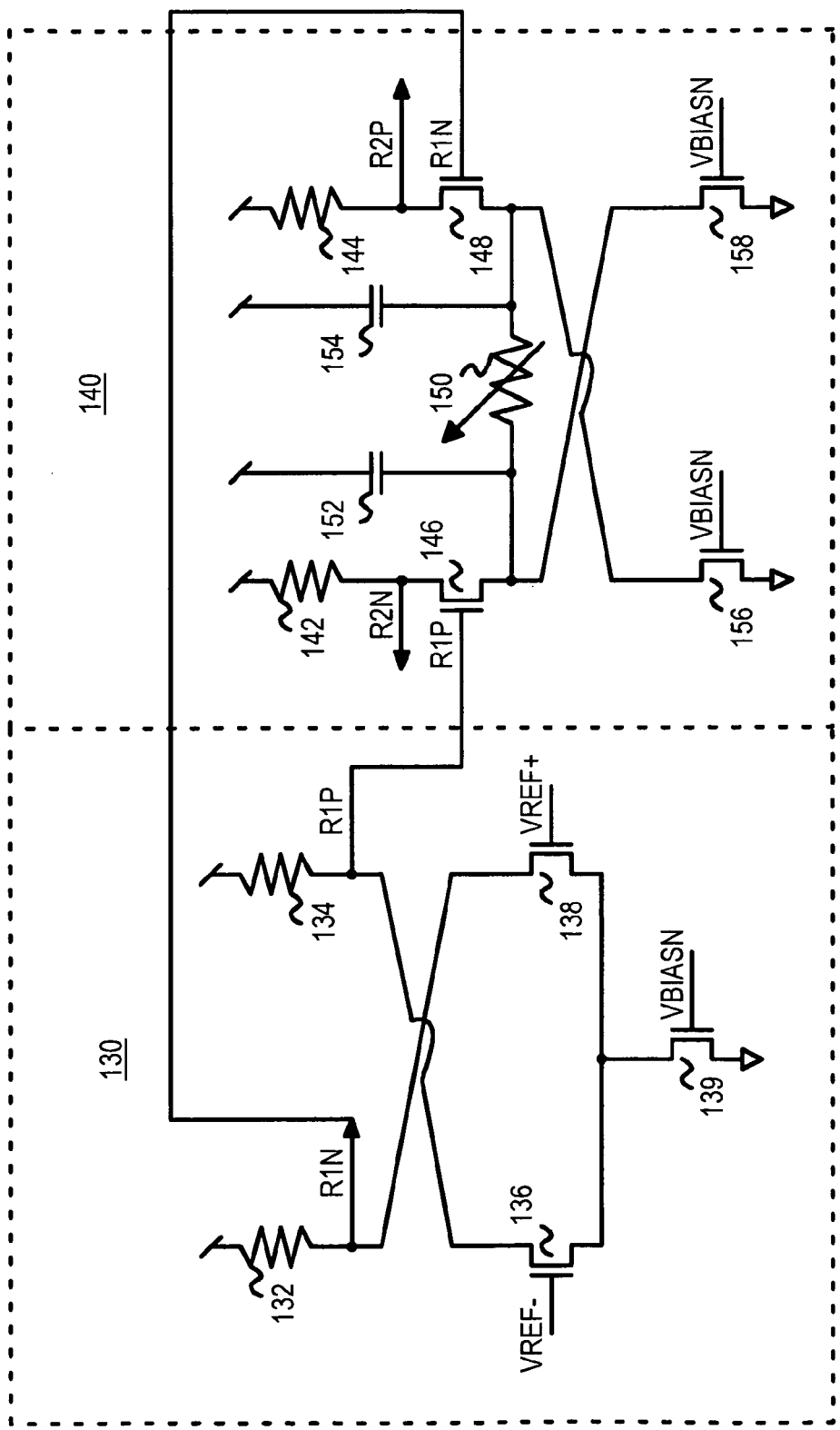
FIG. 3 is a schematic of a reference-voltage equalizer.
Figure 4:
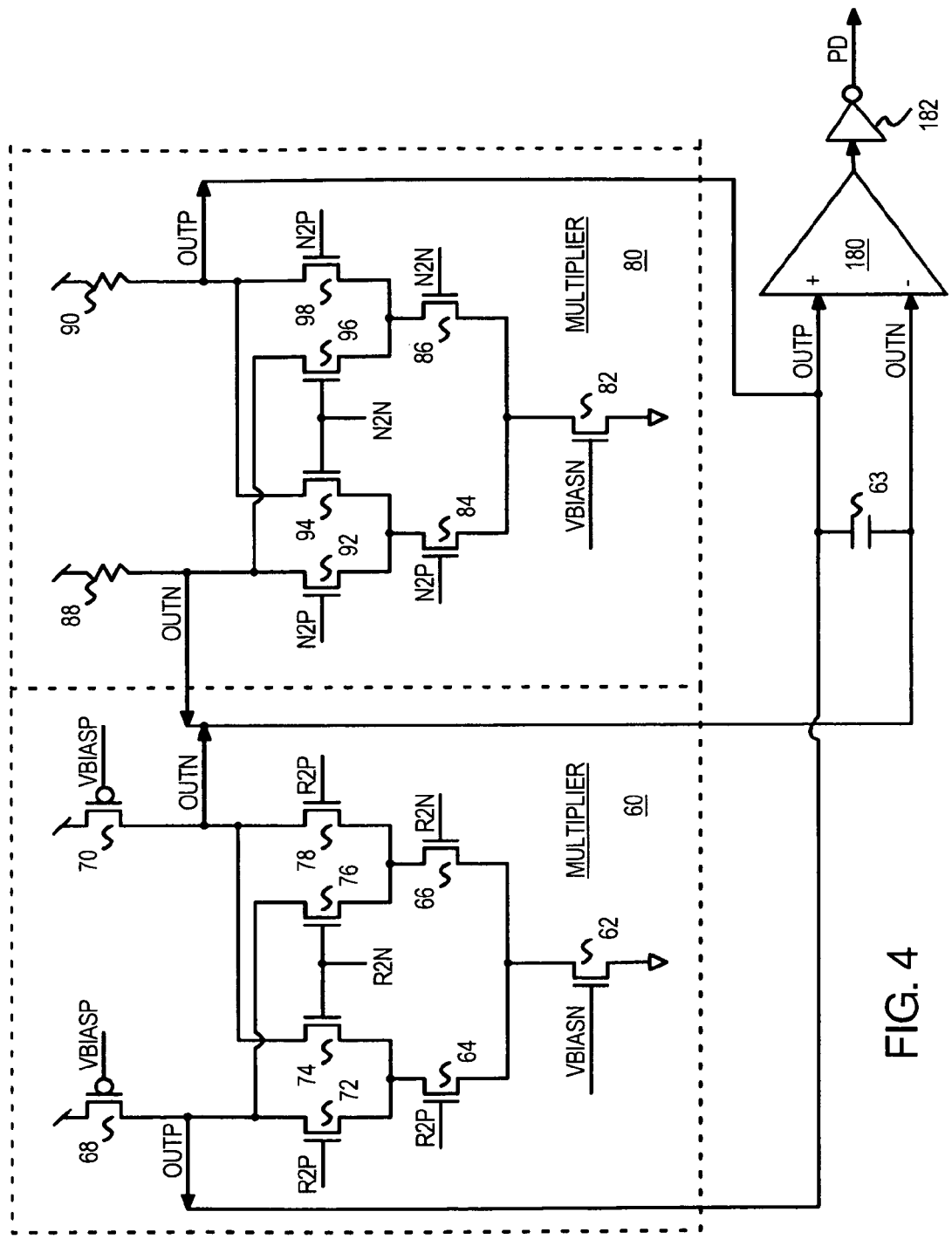
FIG. 4 is a schematic of a final part of a differential equal-voltage detector.

Rather than have differential signals propagated through low-pass filters 14, 16 and input to differential comparator 18, the two pairs of differential signals can be merged at the outputs of differential multipliers 10, 12. For example, the true output of differential multiplier 10 can be connected to the true output of differential multiplier 12 (wired-OR), while the complement output of differential multiplier 10 is connected to the complement output of differential multiplier 12. This embodiment is shown in the schematics of FIGS. 2-4.

Figure 2:
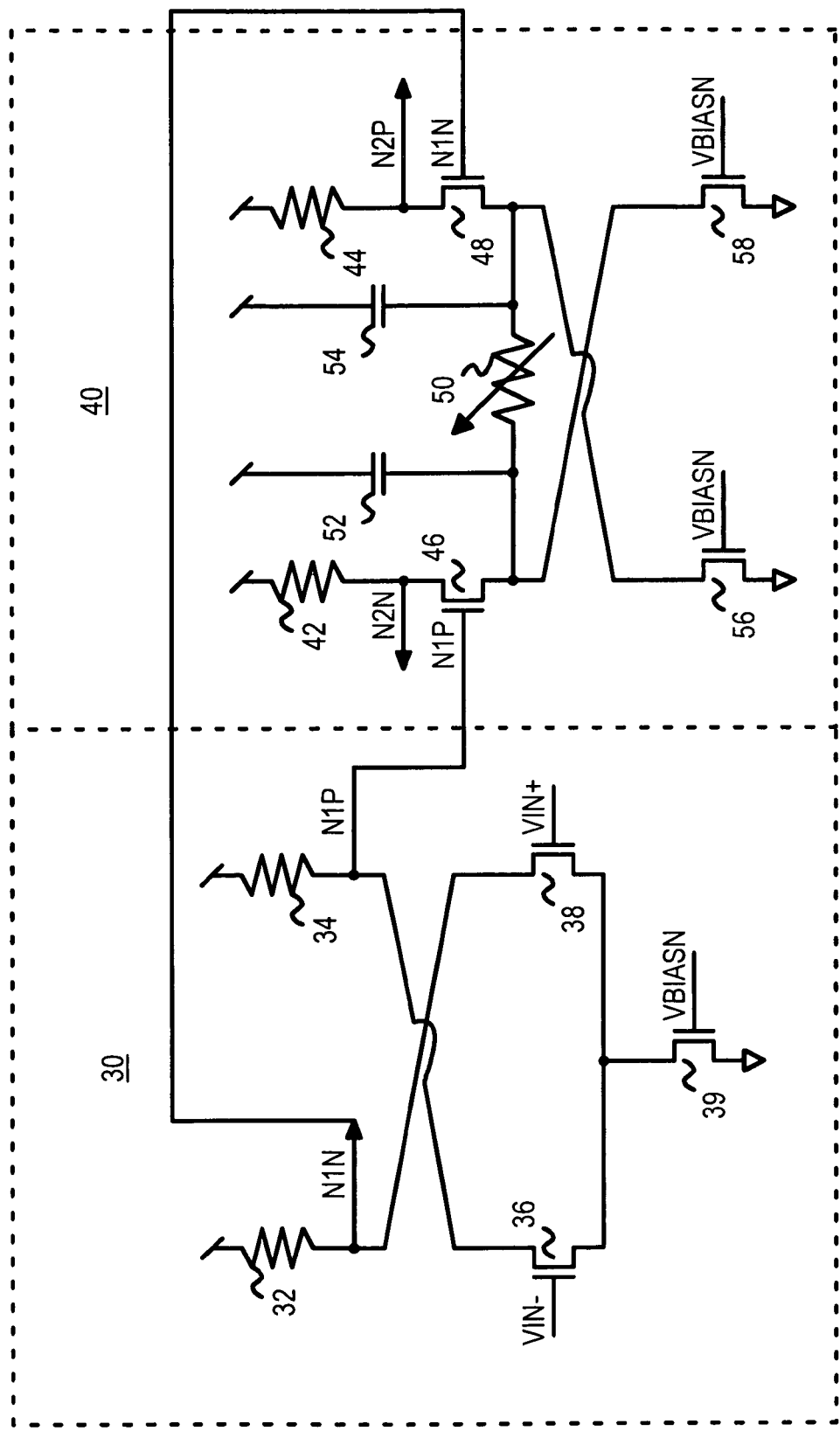
FIG. 2 is a schematic of an equalizer.

FIG. 2 is a schematic of an equalizer. Equalizer 22 receives differential input VIN+, VIN− on the gates of n-channel differential transistors 38, 36, respectively, which have their sources tied together at the drain of n-channel sink transistor 39. The drain of differential transistor 36 is signal N1P. Pull-up resistor 34 sources current to N1P.

The drain of differential transistor 38 is signal N1N. Pull-up resistor 32 sources current to N1N. Signals N1P and N1N from first equalizer stage 30 are input to second equalizer stage 40

Signal N1P is applied to the gate of n-channel differential transistor 46, while signal N1N is applied to the gate of n-channel differential transistor 48 in second equalize stage 40. N-channel sink transistor 58 is connected to the source of differential transistor 46 while n-channel sink transistor 56 is connected to the source of differential transistor 48. Sink transistors 39, 56, 58 receive a bias voltage VBIASN on their gates and have their sources connected to ground.

The drain of differential transistor 46 is signal N2N. Pull-up resistor 42 sources current to N2N. The drain of differential transistor 48 is signal N2P. Pull-up resistor 44 sources current to N2P. Signals N2P, N2N are the equalized outputs from equalizer 22 to differential multiplier 10.

Equalizing resistor 50 connects the sources of differential transistors 46, 48 and provides equalization. Capacitors 52, 54 are connected between sources of differential transistors 46, 48 and power. The values of some or all of equalizing resistor 50 and capacitors 52, 54 and VBIASN may be controlled by the equalizing control input EQ_CTL (FIG. 1) to control the amount of attenuation of different frequency components. For example, resistor 50 may be a variable resistor with EQ_CTL controlling its resistance value.

FIG. 3 is a schematic of a reference-voltage equalizer. Equalizer 24 is similar to equalizer 22 of FIG. 3, but receives differential reference input VREF+, VREF− on the gates of n-channel differential transistors 138, 136, respectively, which have their sources tied together at the drain of n-channel sink transistor 139. The drain of differential transistor 136 is signal R1P. Pull-up resistor 134 sources current to R1P.

The drain of differential transistor 138 is signal R1N. Pull-up resistor 132 sources current to N1N. Signals R1P and R1N from first equalizer stage 130 are input to second equalizer stage 140

Signal R1P is applied to the gate of n-channel differential transistor 146, while signal R1N is applied to the gate of n-channel differential transistor 148 in second equalizer stage 140. N-channel sink transistor 158 is connected to the source of differential transistor 146 while n-channel sink transistor 156 is connected to the source of differential transistor 148. Sink transistors 139, 156, 158 receive bias voltage VBIASN on their gates and have their sources connected to ground.

The drain of differential transistor 146 is signal R2N. Pull-up resistor 142 sources current to R2N. The drain of differential transistor 148 is signal R2P. Pull-up resistor 144 sources current to R2P. Signals R2P, R2N are the equalized outputs from equalizer 22 to differential multiplier 10.

Equalizing resistor 150 connects the sources of differential transistors 146, 148 and provides equalization. Capacitors 152, 154 are connected between sources of differential transistors 146, 148 and power. The values of some or all of equalizing resistor 150 and capacitors 152, 154 and VBIASN may be controlled by the equalizing control input EQ_CTL (FIG. 1) to control the amount of attenuation of different frequency components.

FIG. 4 is a schematic of a final part of a differential equal-voltage detector. Equalized differential reference-voltage inputs R2P, R2N, from equalizer 24 of FIG. 3 are applied to first differential multiplier 60, which is a Gilbert multiplier. N-channel tail transistor 62 receives a bias voltage VBIASN on its gate, and sinks a constant current that is combined from the four current legs of n-channel multiplier transistors 72, 74, 76, 78, which are summed through n-channel differential transistors 64, 66, which each receive either R2P or R2N on their gates. P-channel current source transistors 68, 70 each have their gates driven by bias voltage VBIASP. The drain of p-channel source transistor 68 is node OUTP, while drain of p-channel source transistor 70 is node OUTN. Nodes OUTP, OUTN are the outputs of first differential multiplier 60.

Equalized differential signal-voltage inputs N2P, N2N, from equalizer 22 of FIG. 2 are applied to second differential multiplier 80, which is a Gilbert cell multiplier. N-channel tail transistor 82 receives bias voltage VBIASN on its gate, and sinks a constant current that is combined from the four current legs of n-channel multiplier transistors 92, 94, 96, 98, which are summed through n-channel differential transistors 84, 86. Transistors 92, 98, 84 receive N2P on their gates, while transistors 94, 96, 86 receive N2N on their gates.

Resistor 88 sources current to OUTN, while resistor 90 sources current to OUTP. Nodes OUTP, OUTN are the outputs of second differential multiplier 80 and also first differential multiplier 60.

Connecting OUTP from first differential multiplier 80 to OUTP from second differential multiplier 90 causes the signal-path and reference-path currents to be summed. A single OUTP input is applied to the non-inverting input of differential comparator 180.

Likewise, connecting OUTN from first differential multiplier 80 to OUTN from second differential multiplier 90 causes the signal-path and reference-path currents to be summed. A single OUTN input is applied to the inverting input of differential comparator 180. Inverter 182 inverts the output of differential comparator 180 to generate the power-down signal PD.

Capacitor 63 is connected between OUTP and OUTN. Capacitor 63 acts as low-pass filters 14, 16 of FIG. 1.

When the differential-mode of VIN+, VIN− is above the differential mode of reference voltage VREF+, VREF−, then power-down output PD is driven low (inactive). When the differential-mode of VIN+, VIN− is below the differential mode of reference voltage VREF+, VREF−, then power-down output PD is driven high (active).

During normal operation when N2P is higher than N2N, multiplier transistors 92, 98, 84, which receive N2P at their gates, have a higher transconductance than multiplier transistors 94, 96, 86 which receive N2N at their gates. Transistors 94, 96, 86 tend to turn off when N2N goes low.

Figure 5:
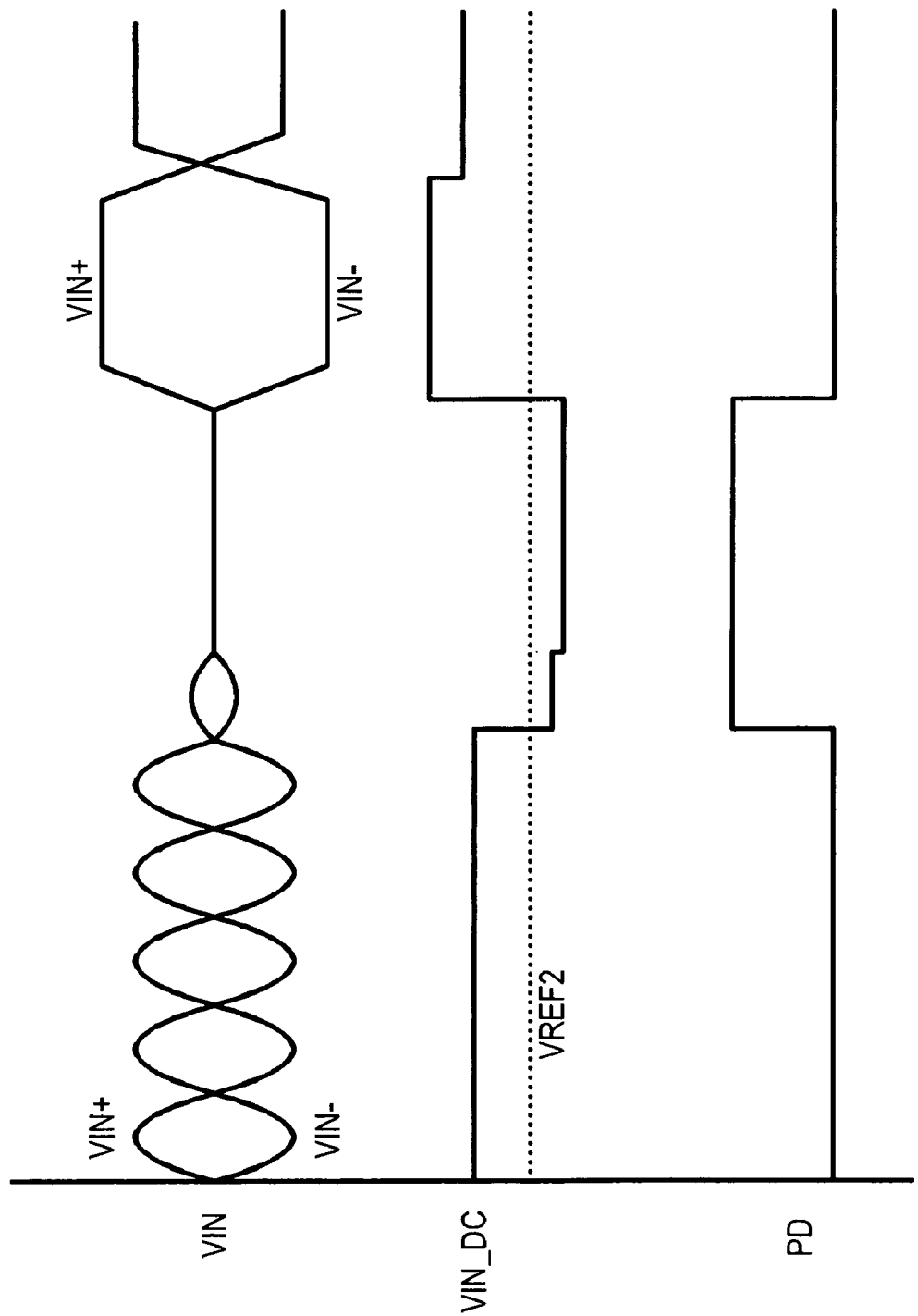
FIG. 5 is a waveform of operation of the equalizing power-down detector of FIGS. 2-4.

FIG. 5 is a waveform of operation of the equalizing power-down detector of FIGS. 2-4. When differential inputs VIN+, VIN− operate normally, as shown by the initial series of sine wave inputs, the square voltage difference VIN_DC is above VREF2. Power-down signal PD is low.

When the differential signal strength weakens, as for the last sine wave in the initial series, the averaged voltage difference VIN_DC falls below VREF2, although VIN_DC is still above zero. Then the power-down signal PD is driven high to power-down the receiver or a sub-system or circuit that uses the differential receiver's output.

When the differential inputs VIN+, VIN− have the same voltage, VIN_DC falls to zero. Since VIN_DC is still below VREF2, power-down signal PD remains active.

When VIN+, VIN− again diverge, as shown by the rectangular wave sequence at the right of the waveform, the large input-voltage difference causes VIN_DC to rise above VREF2. The power-down signal PD is driven low to deactivate the power-down mode. Note that different voltage differences produce different values of VIN_DC that are still above VREF2.

Alternate Embodiments

Several other embodiments are contemplated by the inventor. Many kinds of implementations of the blocks described herein could be substituted. For example other components such as capacitors, resistors, buffers, and transistors may be added. Inversions may be added using inverters or by swapping differential lines. Many choices for transistor device sizes could be made. Additional stages could be added. Many kinds of bias-voltage generators could be used, or an external bias voltage used. Input and output buffers and drivers could be added. The sensitivity and switching threshold of the detector may be adjusted by varying ratios of transistor sizes.

Different filtering may be used, including addition of capacitors of the use of parasitic resistances and capacitances. Larger capacitance values can further smooth intra-cycle variations and prevent false triggering at cross-over when VIN+, VIN− are momentarily equal. Other kinds of multipliers and equalizers could be substituted. The equal voltage that is detected on the inputs to generate power-down does not have to be exactly equal, but can be equal within a tolerance, such as equal within 5%, equal within 10%, etc. The power-down detection may detect near-equal voltages as the equal voltage before the voltages fully converge to a fully equal voltage.

The low pass filter in FIG. 4 or other figures may be altered. Capacitor 63 and resistor 88, 90 in FIG. 4 form the low-pass filter. The low pass filter may have different configurations. For example, p-channel transistors 68, 70 may be changed to resistors in FIG. 4. Two capacitors may be added, one connected between the lower terminals of resistors 88, 90. The other capacitor is connected between the lower terminals of resistors 68, 70. The first capacitor and resistors 68, 70 form low-pass filter 16 of FIG. 1. The second capacitor and resistors 88, 90 form low-pass filter 14 of FIG. 1.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. An equalizing differential equal-voltage detector comprising:
   a differential input including a true differential input and a complement differential input, the true and complement differential inputs being driven to opposite states during normal operation, but the true and complement differential inputs having an equal voltage when an input-failure occurs;
   an equalizer, receiving the true and complement differential inputs, for attenuating frequency components to generate equalized true and complement differential inputs;
   a multiplier, receiving the equalized true and complement differential inputs from the equalizer, for multiplying a voltage difference between the equalized true and complement differential inputs to generate a multiplied voltage;
   a low-pass filter, coupled to the multiplier, for filtering the multiplied voltage to smooth variations in the multiplied voltage to generate an averaged voltage; and
   a comparator, coupled to receive the averaged voltage, for comparing the averaged voltage to a reference voltage, and for activating a detect signal when the averaged voltage is below the reference voltage,
   whereby the detect signal is activated when the voltage difference is below a threshold to signal the input-failure.

2. The equalizing differential equal-voltage detector of claim 1 further comprising:
- a reference equalizer, receiving a true and a complement reference voltage, for attenuating frequency components to generate an equalized true and complement differential reference;
- a reference multiplier, receiving the equalized true and complement differential reference from the reference equalizer, for multiplying a voltage difference between the equalized true and complement differential reference to generate a multiplied reference voltage;
- a reference low-pass filter, coupled to the reference multiplier, for filtering the multiplied reference voltage to smooth variations in the multiplied voltage to generate an averaged reference voltage,
- wherein the averaged reference voltage is applied to the comparator as the reference voltage,
- whereby the reference voltage is generated by the reference equalizer, reference multiplier, and reference low-pass filter.

3. The equalizing differential equal-voltage detector of claim 2 wherein variations in process, supply-voltage, and temperature of the equalizer, multiplier, and low-pass filter are tracked by the reference equalizer, reference multiplier, and reference low-pass filter.

4. The equalizing differential equal-voltage detector of claim 2 further comprising:
- a driver, receiving the detect signal, for activating a power-down signal that powers down a circuit that processes signals carried by the differential input when the detect signal is activated,
- whereby power-down occurs when the input-failure is detected by detecting equal differential voltages.

5. The equalizing differential equal-voltage detector of claim 2 wherein the equalizer comprises:
- a first-stage current sink;
- a true first-stage differential transistor that conducts current between a first inter-stage node and the first-stage current sink in response to a gate that receives the true differential input;
- a true first-stage current source to the first inter-stage node;
- a complement first-stage differential transistor that conducts current between a second inter-stage node and the first-stage current sink in response to a gate that receives the complement differential input;
- a complement first-stage current source to the second inter-stage node;
- a true second-stage current sink connected to a true equalizing node;
- a true second-stage differential transistor that conducts current between the equalized true differential input and the true equalizing node in response to a gate that receives the first inter-stage node;
- a true second-stage current source to the equalized true differential input;
- a complement second-stage current sink connected to a complement equalizing node;
- a complement second-stage differential transistor that conducts current between the equalized complement differential input and the complement equalizing node in response to a gate that receives the second inter-stage node;
- a complement second-stage current source to the equalized complement differential input; and
- an equalizing resistor coupled between the true equalizing node and the complement equalizing node.

6. The equalizing differential equal-voltage detector of claim 5 wherein the reference equalizer is an identical circuit of the equalizer but receives true and a complement reference voltage in place of the true and complement inputs, and generates the equalized true and complement differential reference in place of the equalized true and complement inputs.

7. The equalizing differential equal-voltage detector of claim 5 further comprising:
- an equalizing control signal applied to the equalizer and to the reference equalizer, the equalizing control signal selecting attenuation of frequency components by the equalizer and by the reference equalizer,
- whereby frequency component attenuation is controlled in both the equalizer and the reference equalizer by a same equalizing control signal.

8. The equalizing differential equal-voltage detector of claim 7 wherein the true first-stage differential transistor, the complement second-stage differential transistor, and the complement second-stage differential transistor are n-channel transistors.

9. The equalizing differential equal-voltage detector of claim 8 wherein the first-stage current sink, the true second-stage current sink, and the complement second-stage current sink each comprise an n-channel transistor to ground having a gate driven by a bias voltage,
- wherein a voltage of the bias voltage is controlled by the equalizing control signal.

10. The equalizing differential equal-voltage detector of claim 2 wherein the multiplier is a Gilbert cell.

11. The equalizing differential equal-voltage detector of claim 10 wherein the Gilbert cell comprises:
- a current sink;
- a first current source for sourcing a first current;
- a second current source for sourcing a second current;
- a first differential transistor that conducts a first current between a first differential node and the current sink, the first current being responsive to a gate that receives the equalized complement differential input,
- a first multiplier transistor that conducts current between the first current source and the first differential node in response to a gate that receives the equalized true differential input;
- a first crossover multiplier transistor that conducts current between the second current source and the first differential node in response to a gate that receives the equalized complement differential input;
- a second differential transistor that conducts a second current between a second differential node and the current sink, the second current being responsive to a gate that receives the equalized true differential input,
- a second multiplier transistor that conducts current between the second current source and the second differential node in response to a gate that receives the equalized true differential input;
- a second crossover multiplier transistor that conducts current between the first current source and the second differential node in response to a gate that receives the equalized complement differential input.

12. The equalizing differential equal-voltage detector of claim 11 wherein a first output of the Gilbert cell is a first node between the first current source and the first multiplier transistor;
- wherein a second output of the Gilbert cell is a second node between the second current source and the second multiplier transistor.

13. The equalizing differential equal-voltage detector of claim 12 wherein the first and second differential transistors, the first multiplier transistor, the first crossover multiplier transistor, the second multiplier transistor, and the second crossover multiplier transistor are n-channel transistors.

14. The equalizing differential equal-voltage detector of claim 12 wherein the low-pass filter comprises:
a capacitor connected between the first and second outputs of the Gilbert cell, producing the averaged voltage.

15. The equalizing differential equal-voltage detector of claim 14 wherein the comparator comprises:
an operational amplifier that receives the averaged voltage and the reference voltage, the operational amplifier having a switching threshold at the reference voltage, wherein when the averaged voltage is above the switching threshold the operational amplifier drives the detect signal into a first state, but when the averaged voltage is below the switching threshold the operational amplifier drives the detect signal into a second state.

16. An equalizing power-down detector comprising:
a true differential line and a complement differential line having a voltage difference when driven, but having substantially equal voltages when not driven;
a tail current sink between a tail node and a ground;
a first current source between a power supply and a first intermediate node;
a second current source between the power supply and a second intermediate node;
a first differential transistor between the first intermediate node and the tail node, having a gate receiving the true differential line;
a second differential transistor between the second intermediate node and the tail node, having a gate receiving the complement differential line;
a first equalizing transistor between a first equalizer-output node and a first equalizing node, having a gate receiving the first intermediate node;
a first sink transistor between the first equalizing node and the ground, having a gate receiving a bias voltage;
a third current source between the power supply and the first equalizer-output node;
a second equalizing transistor between a second equalizer-output node and a second equalizing node, having a gate receiving the second intermediate node;
a second sink transistor between the second equalizing node and the ground, having a gate receiving the bias voltage;
a fourth current source between the power supply and the second equalizer-output node;
an equalizing resistor between the first equalizing node and the second equalizing node;
a multiplier current sink;
a first multiplier current source for sourcing a first multiplier current to a first multiplier-output node;
a second multiplier current source for sourcing a second multiplier current to a second multiplier-output node;
a first multiplier differential transistor that conducts a first current between a first differential node and the multiplier current sink, the first current being responsive to a gate that receives the second equalizer-output node,
a first multiplier transistor that conducts current between the first multiplier-output node and the first differential node in response to a gate that receives the first equalizer-output node;
a first crossover multiplier transistor that conducts current between the second multiplier-output node and the first differential node in response to a gate that receives the second equalizer-output node;

a second multiplier differential transistor that conducts a second current between a second differential node and the multiplier current sink, the second current being responsive to a gate that receives the first equalizer-output node,
a second multiplier transistor that conducts current between the second multiplier-output node and the second differential node in response to a gate that receives the first equalizer-output node;
a second crossover multiplier transistor that conducts current between the first multiplier-output node and the second differential node in response to a gate that receives the second equalizer-output node;
a differential converter, receiving the first multiplier-output node and the second multiplier-output node, for driving a power-down output to a first state when the substantially equal voltages are detected on the true and complement differential lines, but for driving the power-down output to a second state when the voltage difference is detected between the true and complement differential lines; and
whereby power down is activated by detecting substantially equal voltages on the true and complement differential lines.

17. The equalizing power-down detector of claim 16 further comprising:
a filter capacitance coupled between the first multiplier-output node and the second multiplier-output node.

18. The equalizing power-down detector of claim 17 further comprising a reference path which comprises:
a true reference line and a complement reference line having a reference voltage;
a reference tail current sink between a reference tail node and the ground;
a first reference intermediate current source between the power supply and a first reference intermediate node;
a second reference intermediate current source between the power supply and a second reference intermediate node;
a first reference differential transistor between the first reference intermediate node and the tail node, having a gate receiving the true reference line;
a second reference differential transistor between the second reference intermediate node and the tail node, having a gate receiving the complement reference line;
a first reference equalizing transistor between a first reference equalizer-output node and a first reference equalizing node, having a gate receiving the first reference intermediate node;
a first reference sink transistor between the first reference equalizing node and the ground, having a gate receiving the bias voltage;
a first reference current source between the power supply and the first reference equalizer-output node;
a second reference equalizing transistor between a second reference equalizer-output node and a second reference equalizing node, having a gate receiving the second reference intermediate node;
a second reference sink transistor between the second reference equalizing node and the ground, having a gate receiving the bias voltage;
a second reference current source between the power supply and the second reference equalizer-output node;
an equalizing resistor between the first reference equalizing node and the second reference equalizing node;
a reference multiplier current sink;

a first reference multiplier current source for sourcing a first reference multiplier current to a first reference multiplier-output node;

a second reference multiplier current source for sourcing a second reference multiplier current to a second reference multiplier-output node;

a first reference multiplier differential transistor that conducts a first reference current between a first reference differential node and the reference multiplier current sink, the first reference current being responsive to a gate that receives the second reference equalizer-output node, a first reference multiplier transistor that conducts current between the first reference multiplier-output node and the first reference differential node in response to a gate that receives the first reference equalizer-output node;

a first reference crossover multiplier transistor that conducts current between the second reference multiplier-output node and the first reference differential node in response to a gate that receives the second reference equalizer-output node;

a second reference multiplier differential transistor that conducts a second reference current between a second reference differential node and the reference multiplier current sink, the second reference current being responsive to a gate that receives the first reference equalizer-output node, a second reference multiplier transistor that conducts current between the second reference multiplier-output node and the second reference differential node in response to a gate that receives the first reference equalizer-output node; and a second reference crossover multiplier transistor that conducts current between the first reference multiplier-output node and the second reference differential node in response to a gate that receives the second reference equalizer-output node;

wherein the first reference multiplier-output node is connected to the first multiplier-output node;

wherein the second reference multiplier-output node is connected to the second multiplier-output node;

whereby the reference path connects to the first multiplier-output node and the second multiplier-output node.

19. An equal-voltage detector comprising:

a differential input including a true differential input and a complement differential input, the true and complement differential inputs being driven to opposite states during normal operation, but the true and complement differential inputs having an equal voltage when an input-failure occurs;

equalizer means, receiving the true and complement differential inputs, for attenuating frequency components to generate equalized true and complement differential inputs;

multiplier means, receiving the equalized true and complement differential inputs from the equalizer means, for multiplying a voltage difference between the equalized true and complement differential inputs to generate a multiplied voltage;

filter means, coupled to the multiplier means, for filtering the multiplied voltage to smooth variations in the multiplied voltage to generate an averaged voltage;

compare means, coupled to receive the averaged voltage, for comparing the averaged voltage to a reference voltage, and for activating a detect signal when the averaged voltage is below the reference voltage;

reference equalizer means, receiving a true and a complement reference voltage, for attenuating frequency components to generate an equalized true and complement differential reference;

reference multiplier means, receiving the equalized true and complement differential reference from the reference equalizer means, for multiplying a voltage difference between the equalized true and complement differential reference to generate a multiplied reference voltage;

reference filter means, coupled to the reference multiplier means, for filtering the multiplied reference voltage to smooth variations in the multiplied voltage to generate an averaged reference voltage, wherein the averaged reference voltage is applied to the compare means as the reference voltage, whereby the detect signal is activated when the voltage difference is below a threshold to signal the input-failure.

20. The equal-voltage detector of claim 19 wherein the equalizer means comprises:

a first-stage current sink transistor;

true first-stage differential transistor means for conducting current between a first inter-stage node and the first-stage current sink transistor in response to a gate that receives the true differential input;

a true first-stage current source to the first inter-stage node;

complement first-stage differential transistor means for conducting current between a second inter-stage node and the first-stage current sink transistor in response to a gate that receives the complement differential input;

a complement first-stage current source to the second inter-stage node;

a true second-stage current sink connected to a true equalizing node;

true second-stage differential transistor means for conducting current between the equalized true differential input and the true equalizing node in response to a gate that receives the first inter-stage node;

a true second-stage current source to the equalized true differential input;

a complement second-stage current sink connected to a complement equalizing node;

complement second-stage differential transistor means for conducting current between the equalized complement differential input and the complement equalizing node in response to a gate that receives the second inter-stage node;

a complement second-stage current source to the equalized complement differential input; and an equalizing resistor coupled between the true equalizing node and the complement equalizing node.

* * * * *